United States Patent
Ma

(10) Patent No.: US 9,560,756 B2
(45) Date of Patent: Jan. 31, 2017

(54) ARRAY SUBSTRATE ASSEMBLY AND DISPLAY DEVICE

(71) Applicants: Hefei BOE Optoelectronics Technology Co., LTD., Anhui (CN); BOE Technology Group Co., LTD., Beijing (CN)

(72) Inventor: Juncai Ma, Beijing (CN)

(73) Assignees: Hefei BOE Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 211 days.

(21) Appl. No.: 14/202,333

(22) Filed: Mar. 10, 2014

(65) Prior Publication Data

US 2014/0362542 A1 Dec. 11, 2014

(30) Foreign Application Priority Data

Jun. 9, 2013 (CN) .................... 2013 2 0333050 U

(51) Int. Cl.
*H01R 9/00* (2006.01)
*H05K 1/11* (2006.01)
(Continued)

(52) U.S. Cl.
CPC ........... *H05K 1/111* (2013.01); *G02F 1/13458* (2013.01); *G02F 1/13452* (2013.01);
(Continued)

(58) Field of Classification Search
CPC ............ G02F 1/13452; G02F 1/13454; G09G 2300/0408; H05K 2201/10681; H05K 1/181; H05K 1/182; H05K 1/183; H05K 1/184; H05K 2201/10803
(Continued)

(56) References Cited

U.S. PATENT DOCUMENTS

| 6,172,732 B1 * | 1/2001 | Hayakawa ............ G02F 1/1345 349/139 |
| 2006/0007086 A1 * | 1/2006 | Rhee ................... G02F 1/13452 345/87 |

(Continued)

*Primary Examiner* — Binh Tran
(74) *Attorney, Agent, or Firm* — Westman, Champlin & Koehler, P.A.

(57) ABSTRACT

The present invention relates to an array substrate assembly and a display device. The array substrate assembly comprises a substrate; a first metal line formed at one side of the substrate; an insulating layer formed on the first metal line; a second metal line formed on the insulating layer, wherein one end of the second metal line connected with a driving circuit is formed with a second terminal, wherein in a thickness direction of the substrate, a distance between a surface of the second terminal away from the one side of the substrate and the substrate is less than a distance between a surface of the second metal line away from the one side of the substrate and the substrate. The display device includes the array substrate assembly. With the solution of the present invention, when the array substrate assembly is connected to IC or COF, deformation difference between a conducting gold ball at a gate line terminal and a conducting gold ball at a date line is small, thus impedances at the two terminals are close to each other, and therefore image quality of the display device is improved.

12 Claims, 4 Drawing Sheets

(51) Int. Cl.
  *H05K 7/00* (2006.01)
  *H05K 7/10* (2006.01)
  *G02F 1/1345* (2006.01)
  *H05K 1/18* (2006.01)

(52) U.S. Cl.
  CPC .......... *G02F 1/13454* (2013.01); *H05K 1/181* (2013.01); *H05K 2201/094* (2013.01); *H05K 2201/09436* (2013.01); *H05K 2201/09709* (2013.01); *H05K 2201/09736* (2013.01); *H05K 2201/09845* (2013.01); *H05K 2201/10234* (2013.01); *Y02P 70/611* (2015.11)

(58) Field of Classification Search
  USPC ....... 361/748, 749, 760, 764, 767, 772, 773, 361/774, 777, 783; 349/150, 151, 152
  See application file for complete search history.

(56) References Cited

U.S. PATENT DOCUMENTS

2006/0049407 A1* 3/2006 Jung ................. H01L 27/12
                                              257/72
2007/0042613 A1* 2/2007 Yoda ................ B41J 2/14233
                                              439/34

\* cited by examiner

ARRAY SUBSTRATE ASSEMBLY AND DISPLAY DEVICE

CROSS-REFERENCE TO RELATED APPLICATION

This application claims the benefit of Chinese Patent Application No. 201320333050.2 filed on Jun. 9, 2013 in the State Intellectual Property Office of China, the whole disclosure of which is incorporated herein by reference.

BACKGROUND OF THE INVENTION

Field of the Invention

The present invention relates to the field of display technology, and particularly to an array substrate assembly and a display device.

Description of the Related Art

With the development of liquid crystal technique, image quality requirements for a display device become higher. In existing array substrate assemblies, small terminals are provided at terminal regions. FIG. 1a schematically shows a terminal region of an existing array substrate assembly, FIG. 1b is a sectional view in A-A' direction in FIG. 1a, and FIG. 1c is a section view in B-B' direction in FIG. 1a, wherein reference numerals 100, 101, 102, 103, 104 and 105 indicate a substrate, an insulating layer, a gate line, a date line, a passivation layer and an ITO (indium tin oxide) layer respectively.

In the prior art, as shown in FIGS. 1a, 1b and 1c, the terminal region is usually designed to have a two-layer-metal structure comprising a gate line metal and a date line metal. However, since there is a height difference between a gate line terminal 102a and a date line terminal 103a, deformation difference between a first conducting gold ball 106 at the gate line terminal 102a and a second conducting gold ball 107 at the data line terminal 103a is large when the array substrate assembly is bonded to an IC (integrated circuit) or a COF (chip on film), as shown in FIG. 1d. The large deformation difference introduces impedance difference and causes signal-attenuation inconsistence, and thus adversely affects image quality.

SUMMARY OF THE INVENTION

The present invention has been made to overcome or alleviate at least one aspect of the above mentioned disadvantages. Specifically, an object of the present invention is to provide an array substrate assembly and a display device to reduce impedance difference at the gate line terminal and date line terminal.

According to one embodiment of the present invention, an array substrate assembly is provided. The array substrate assembly comprises: a substrate; a first metal line formed at one side of the substrate; an insulating layer formed on the first metal line; a second metal line formed on the insulating layer, wherein one end of the second metal line connected with a driving circuit is formed with a second terminal, and wherein in a thickness direction of the substrate, a distance between a surface of the second terminal away from the one side of the substrate and the substrate is less than a distance between a surface of the second metal line away from the one side of the substrate and the substrate.

According to another embodiment of the present invention, an array substrate assembly is provided, and the array substrate assembly comprises: a substrate; first metal line formed on one side of the substrate, wherein one end of the first metal line which is connected with a driving circuit is formed with a first terminal; an insulating layer formed on the first metal line; a second metal line formed on the insulating layer, wherein one end of the second metal line which is connected with the driving circuit is formed with a second terminal, wherein in a thickness direction of the substrate, a distance between a surface of the second terminal away from the one side of the substrate and a surface of the first terminal away from the one side of the substrate is less than a distance between a surface of the second metal line away from the one side of the substrate and the surface of the first terminal away from the one side of the substrate.

The present invention also relates to a display device which includes the above array substrate assembly.

BRIEF DESCRIPTION OF THE DRAWINGS

The above and other features of the present invention will become more apparent by describing in detail exemplary embodiments thereof with reference to the accompanying drawings, in which:

FIG. 1b is a sectional view in A-A' direction in FIG. 1a;

FIG. 1c is a section view in B-B' direction in FIG. 1a;

FIG. 2b is a sectional view in A-A' direction in FIG. 2a;

FIG. 2c is a section view in B-B' direction in FIG. 2a;

FIG. 3b is a sectional view in B-B' direction in FIG. 3a.

DETAILED DESCRIPTION OF PREFERRED EMBODIMENTS OF THE INVENTION

Figure 1A:
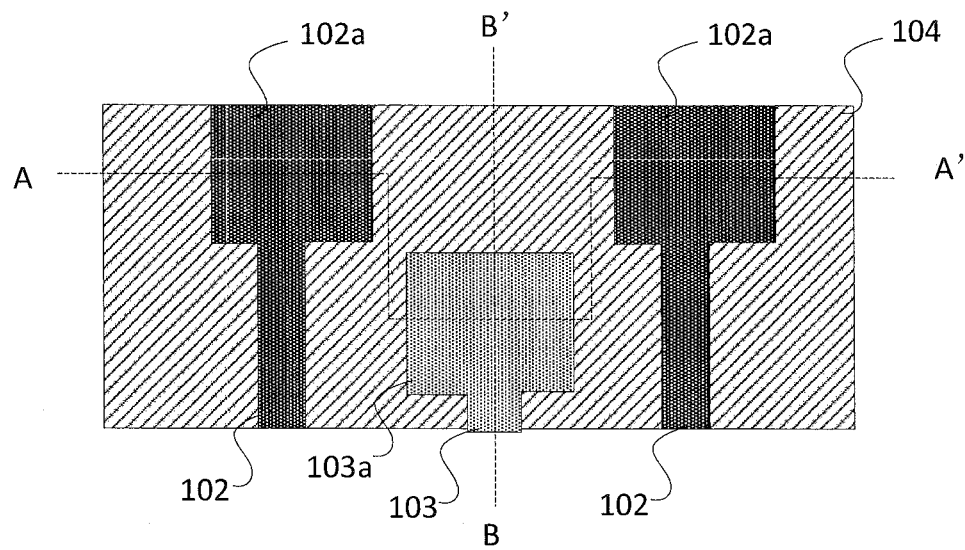
FIG. 1a schematically shows a terminal region of an existing array substrate assembly.
Figure 1B:
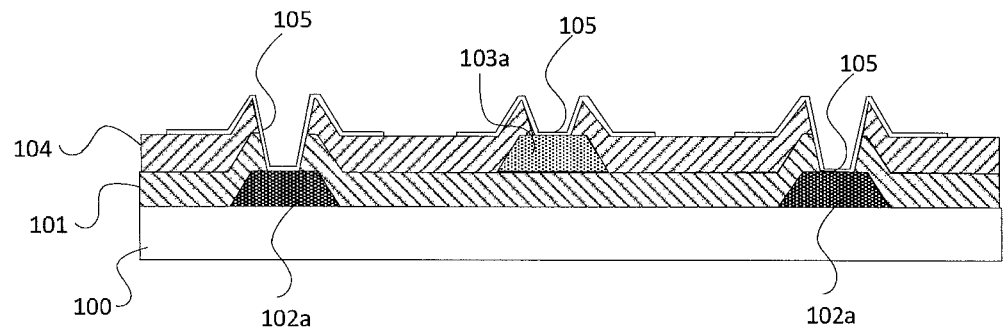
Figure 1C:
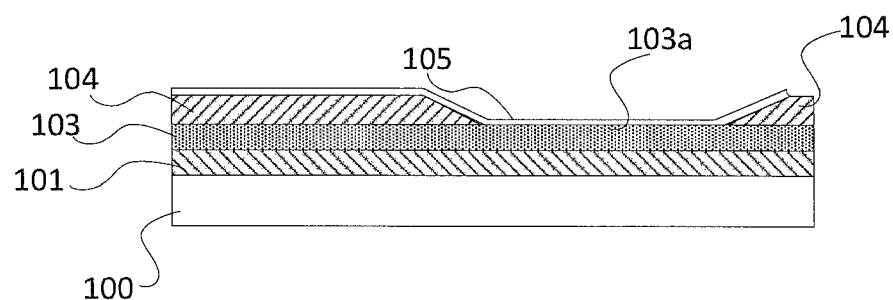
Figure 1D:
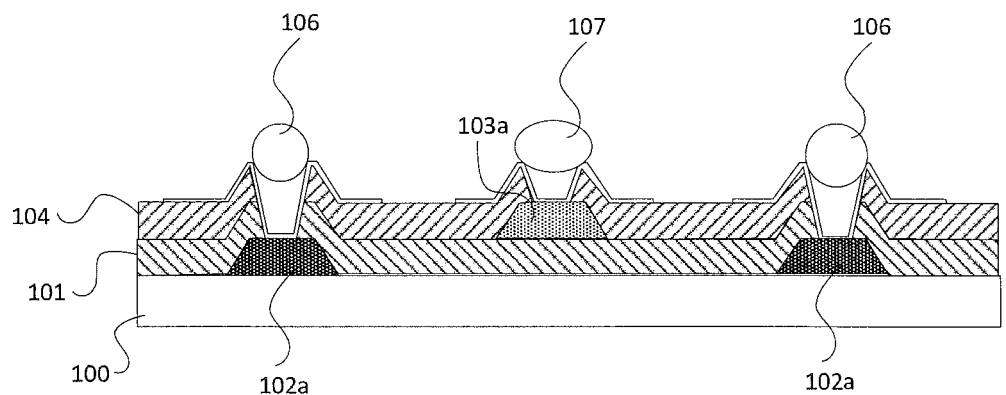
FIG. 1d is a schematic view showing conducting gold balls at a terminal region of an existing array substrate assembly.

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

First Embodiment

Figure 2A:
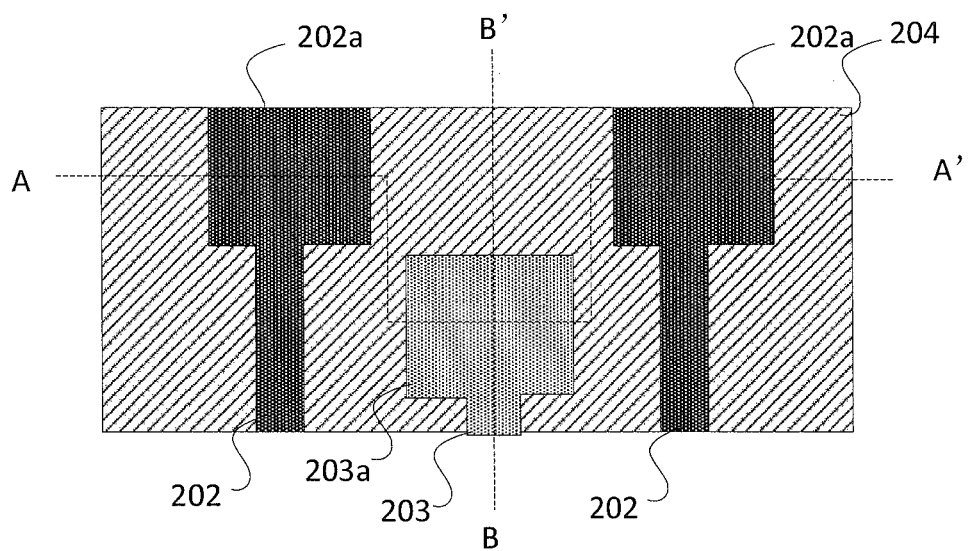
FIG. 2a is a schematic view showing a terminal region of an array substrate assembly according to a first exemplary embodiment of the present invention.
Figure 2B:
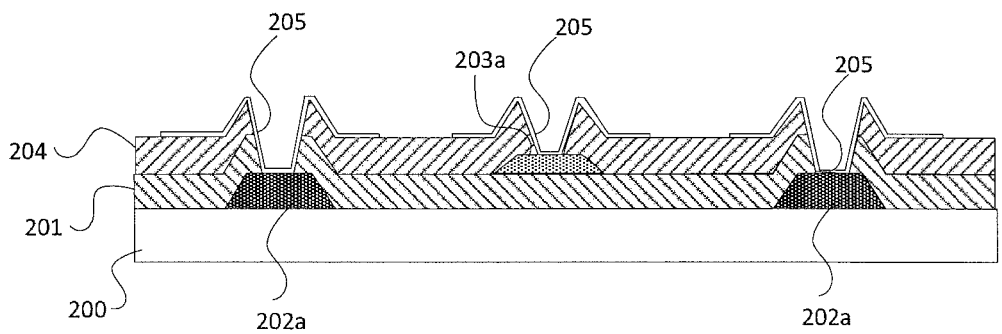

FIG. 2a is a schematic view showing a terminal region of an array substrate assembly according to a first exemplary embodiment of the present invention; FIG. 2b is a sectional view in A-A' direction in FIG. 2a; and FIG. 2c is a section view in B-B' direction in FIG. 2a.

Figure 2C:
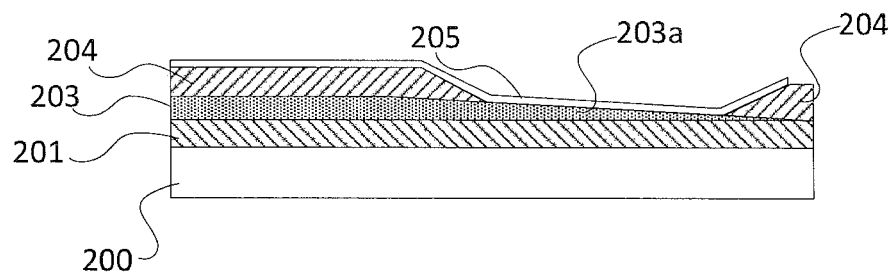

Referring to FIGS. 2a, 2b and 2c, the array substrate assembly comprises: a substrate 200; a first metal line 202 formed at one side of the substrate 200; an insulating layer 201 formed on the first metal line 202; a second metal line 203 formed on the insulating layer 201, and a passivation layer 204 formed on the second metal line 203.

One end of the first metal line 202 connected with a driving circuit is formed with a first terminal 202a, and one end of the second metal line 203 connected with the driving circuit is formed with a second terminal 203a. A region of the insulating layer 201 and the passivation layer 204 corresponding to the first terminal is provided with a first via hole for exposing the first terminal 202a, and a region of the passivation layer 204 corresponding to the second terminal 203a is provided with a second via hole for exposing the second terminal 203a.

Further, an ITO layer 205 may be formed on the first and second via holes. The ITO layer 205 functions to achieve better electrical connection between the first and second terminals 202a, 203a and the corresponding conducting gold balls, and thus to reduce impedance and improve conducting performance.

In an embodiment of the present invention, the first metal line 202 is a gate line, correspondingly, the first terminal 202a is used as a gate line terminal; the second metal line is used as a data line, and correspondingly, the second terminal 203a is used as a data line terminal. It is noted that the first metal line 202 may be a data line, and the second metal line 203 may be gate line.

Figure 2D:
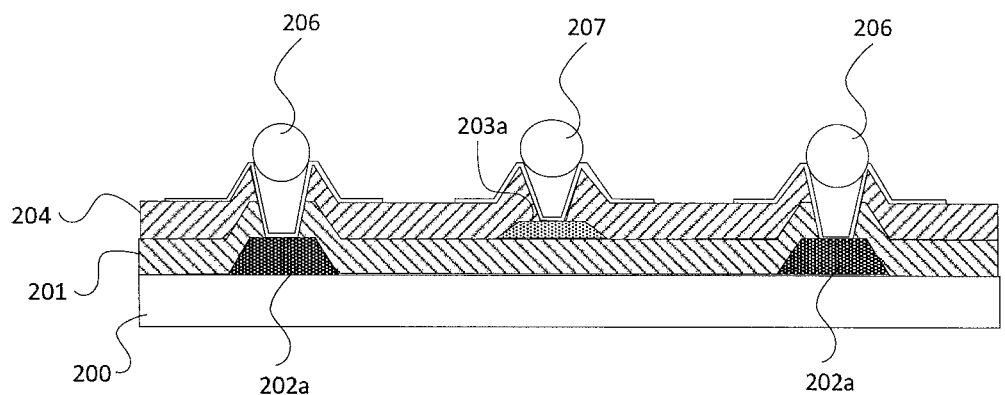
FIG. 2d is a schematic view showing conducting gold balls at the terminal region of array substrate assembly according to the first exemplary embodiment of the present invention.

In the first embodiment of the prevent invention, the second terminal 203a has a wedge shape, and the surface of the second terminal 203a away from the one side of the substrate 200 is an inclined surface, that is, the height of the inclined surface of the second terminal 203a is reduced gradually from a side thereof close to the second metal line 203 to a side thereof away from the second metal line 203. With the above design, a distance between the surface of the second terminal 203a away from the one side of the substrate 200 and the substrate 200 is less than a distance between a surface of the second metal line 203 away from the substrate 200 and the substrate 200, so that the shortest distance between the surface of the second terminal 203a away from the one side of the substrate 200 and the substrate 200 is close to the distance between a surface of the first terminal 202a away from the one side of the substrate 200 and the substrate 200. By means of the above design, referring to FIG. 2d, when the array substrate assembly is connected to IC or COF, deformation difference between a second conducting gold ball 207 at the second terminal 203a and a first conducting gold ball 206 at the first terminal 202a is small, thus impedances at the two terminals are close to each other, and therefore image quality is improved.

Alternatively, a surface of the second terminal 203a close to the one side of the substrate 200 is flush with a surface of the second metal line 203 close to the one side of the substrate 200. That is, the distance between the surface of the second terminal 203a close to the one side of the substrate 200 and the substrate 200 is equal to that between the surface of the second metal line 203 close to the one side of the substrate 300 and the substrate 200.

Second Embodiment

Figure 3A:
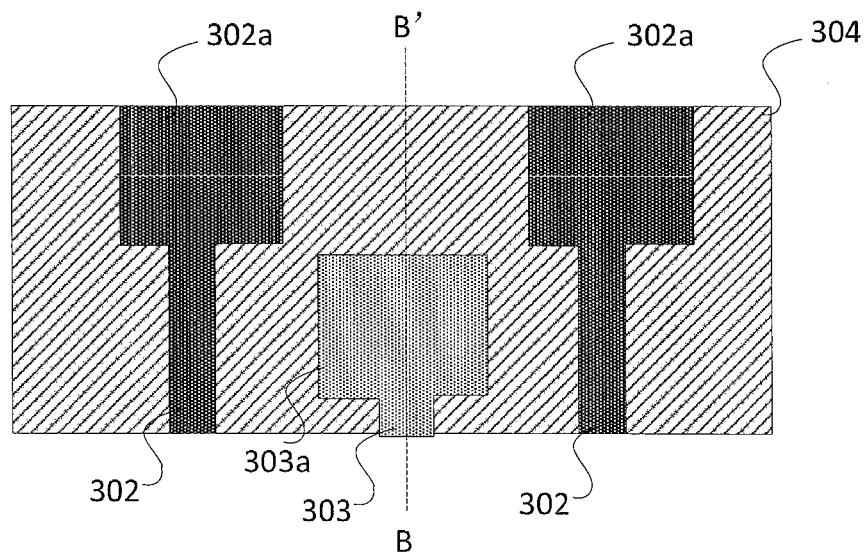
FIG. 3a is a schematic view showing a terminal region of an array substrate assembly according to a second exemplary embodiment of the present invention.
Figure 3B:
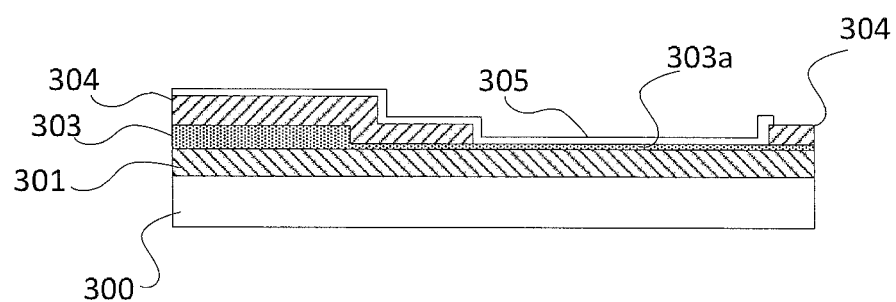

FIG. 3a is a schematic view showing a terminal region of an array substrate assembly according to a second exemplary embodiment of the present invention; and FIG. 3b is a sectional view in B-B' direction in FIG. 3a.

The present embodiment is substantially the same as the first embodiment. Referring to FIGS. 3a and 3b, the array substrate assembly comprises a substrate 300; a first metal line 302 formed at one side of the substrate 300; an insulating layer 301 formed on the first metal line 302; a second metal line 303 formed on the insulating layer 301; and a passivation layer 304 formed on the second metal line 303.

One end of the first metal line 302 connected with a driving circuit is formed with a first terminal 302a, and one end of the second metal line 303 connected with the driving circuit is formed with a second terminal 303a. A region of the insulating layer 301 and the passivation layer 304 corresponding to the first terminal is provided with a first via hole for exposing the first terminal 302a, and a region of the passivation layer 304 corresponding to the second terminal 303a is provided with a second via hole for exposing the second terminal 303a. Further, an ITO layer 305 may be formed on the first and second via holes.

The second embodiment differs from the first embodiment in that: a surface of the second terminal 303a away from the one side of the substrate 300 is a flat surface. That is, the height of the surface of the second terminal 303a away from the one side of the substrate 300 is constant from a side thereof close to the second metal line 303 and a side thereof away from the second metal line 303, and the height is lower than the height of a surface of the second metal line 303 away from the one side of the substrate 300. With the above design, a distance between the surface of the second terminal 303a away from the one side of the substrate 300 and the substrate 300 is close to the distance between the surface of the first terminal 302a away from the one side of the substrate 300 and the substrate 300. Thus, when the array substrate assembly is connected to IC or COF, deformation difference between a second conducting gold ball at the second terminal 303a and a first conducting gold ball at the first terminal 302a is small, thus impedances at the two terminals are close to each other, and therefore image quality is improved.

Alternatively, a surface of the second terminal 303a close to the one side of the substrate 300 is flush with a surface of the second metal line 303 close to the one side of the substrate 300.

In the second embodiment of the present invention, the first metal line 302 is used as a gate line, correspondingly, the first terminal 302a is used as a gate line terminal; the second metal line 303 is used as a data line, and correspondingly, the second terminal 303a is used as a data line terminal. It is noted that the first metal line 302 may be a data line, and the second metal line 303 may be gate line.

Third Embodiment

The present invention also relates to a display device which includes the array substrate assembly of the first embodiment or the second embodiment. The display device may be a liquid crystal TV, a liquid crystal display, a laptop computer, a tablet computer, a smart mobile phone and the like.

In the array substrate assembly and the display device according to the present invention, the thickness of the gate terminal or data line terminal at the terminal region is changed so that the distance between the surface of the gate line terminal away from the one side of the substrate and the substrate is close to the distance between the surface of the data line terminal away from the one side of the substrate and the substrate. Therefore, when the array substrate assembly is connected to IC or COF, the deformation difference of the conducting gold balls at the gate line terminal and the data line terminal is small, and thus impedances at the two terminals are close to each other, in this case, the image quality of the display device is improved, and the problem of poor image quality due to large impedance difference is solved.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

What is claimed is:

1. An array substrate assembly, comprising:
    a substrate;
    a first metal line formed at one side of the substrate;
    an insulating layer formed on the first metal line;
    a second metal line formed on the insulating layer, wherein one end of the second metal line connected with a driving circuit is formed with a second terminal,
    wherein in a thickness direction of the substrate, the thickness of the second metal line is larger than that of the second terminal, such that in a thickness direction of the substrate, a distance between a surface of the second terminal away from the one side of the substrate and the substrate is less than a distance between a surface of the second metal line away from the one side of the substrate and the substrate.

2. The array substrate assembly according to claim 1, wherein
    the second terminal has a wedge shape, and the surface of the second terminal away from the one side of the substrate is an inclined surface.

3. The array substrate assembly according to claim 2, wherein
    a surface of the second terminal close to the one side of the substrate is flush with a surface of the second metal line close to the one side of the substrate.

4. The array substrate assembly according to claim 1, wherein
    the first metal line is used as a gate line, and the second metal line is used as a data line.

5. The array substrate assembly according to claim 1, wherein
    the first metal line is used as a data line, and the second metal line is used as a gate line.

6. The array substrate assembly according to claim 1, wherein
    the substrate further comprises a passivation layer formed on the second metal line, and a region of the passivation layer corresponding to the second terminal is provided with a second via hole for exposing the second terminal.

7. The array substrate assembly according to claim 6, wherein
    one end of the first metal line connected with a driving circuit is formed with a first terminal, and a region of the insulating layer and the passivation layer corresponding to the first terminal is provided with a first via hole for exposing the first terminal.

8. A display device, comprising the array substrate assembly according to claim 1.

9. The array substrate assembly according to claim 1, wherein
    the surface of the second terminal away from the one side of the substrate is a flat surface.

10. The array substrate assembly according to claim 9, wherein
    a surface of the second terminal close to the one side of the substrate is flush with a surface of the second metal line close to the one side of the substrate.

11. An array substrate assembly, comprising:
    a substrate;
    a first metal line formed on one side of the substrate, wherein one end of the first metal line which is connected with a driving circuit is formed with a first terminal;
    an insulating layer formed on the first metal line;
    a second metal line formed on the insulating layer, wherein one end of the second metal line which is connected with the driving circuit is formed with a second terminal,
    wherein in a thickness direction of the substrate, the thickness of the second metal line is larger than that of the second terminal, such that in a thickness direction of the substrate, a distance between a surface of the second terminal away from the one side of the substrate and a surface of the first terminal away from the one side of the substrate is less than a distance between a surface of the second metal line away from the one side of the substrate and the surface of the first terminal away from the one side of the substrate.

12. A display device, comprising the array substrate assembly according to claim 11.

* * * * *